Figure 1:
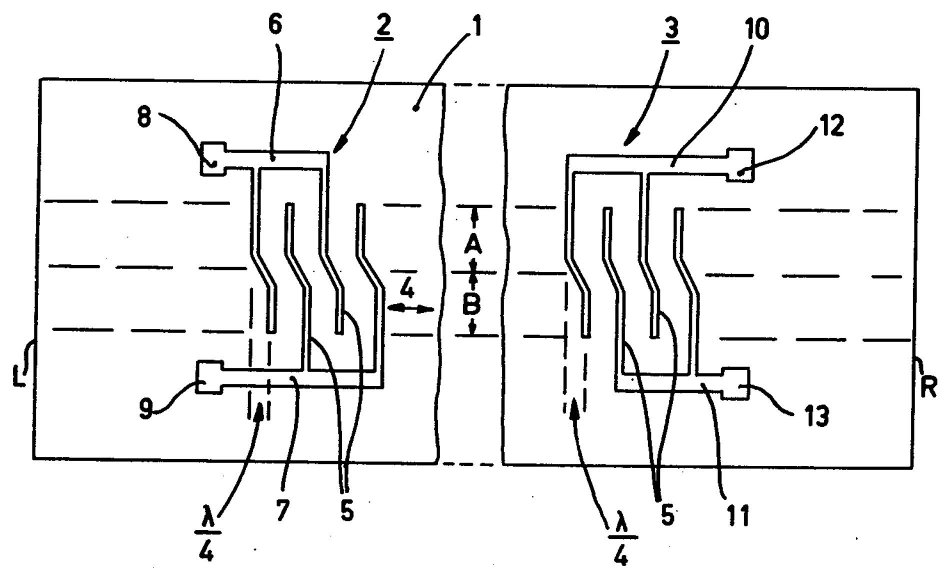

United States Patent [19]

Mitchell et al.

[11] 3,955,159

[45] May 4, 1976

[54] ACOUSTIC SURFACE WAVE DEVICES

[75] Inventors: Richard Frank Mitchell, Kingston; Richard Stevens, Copthorne, both of England

[73] Assignee: U.S. Philips Corporation, New York, N.Y.

[22] Filed: Sept. 13, 1974

[21] Appl. No.: 505,655

[30] Foreign Application Priority Data

Sept. 17, 1973 United Kingdom ............... 43483/73

[52] U.S. Cl. .................................. 333/30 R; 333/72

[51] Int. Cl.[2] .......................................... H03H 7/38

[58] Field of Search ................ 340/15; 333/30 R, 72

[56] References Cited

UNITED STATES PATENTS

| | | | |
|---|---|---|---|
| 3,559,115 | 1/1971 | De Vries | 333/72 |
| 3,596,211 | 7/1971 | Dias et al. | 333/72 |
| 3,727,718 | 4/1973 | Whitehouse | 333/30 R |
| 3,757,256 | 9/1973 | Whitehouse et al. | 333/30 R |
| 3,836,876 | 9/1974 | Marshall et al. | 333/30 R |
| 3,846,722 | 11/1974 | De Klerk | 333/30 R |

*Primary Examiner*—Maynard R. Wilbur
*Assistant Examiner*—T. M. Blum
*Attorney, Agent, or Firm*—Frank R. Trifari; Bernard Franzblau

[57] ABSTRACT

An acoustic surface wave device comprises a launching transducer and a receiving transducer coupled to one surface of a piezoelectric substrate and including means for suppressing spurious signals developed in the receiving transducer due to acoustic surface waves reflected from the ends of the substrate. In one embodiment the electrodes of both transducers are staggered a quarter wavelength at the mid point of their apertures so that waves received direct from the launching transducer arrive in phase at the receiving transducer whereas end reflected waves arrive in antiphase over the two halves of the receiving transducer aperture.

15 Claims, 4 Drawing Figures

ACOUSTIC SURFACE WAVE DEVICES

This invention relates to acoustic surface-wave devices.

The use of acoustic surface waves has made it possible to manufacture devices, such as frequency-selective filters, which are small, compact and are moreover compatible with integrated circuit manufacturing techniques. Such devices enable difficulties such as the bulk and manufacturing cost associated with the provision of inductors to be avoided.

An acoustic surface-wave filter is commonly formed by a thin wafer of piezoelectric material on one surface of which a launching and a receiving transducer are arranged respectively to launch and to receive an acoustic surface wave propagating over the surface. Each transducer normally comprises an interdigital array of strip electrodes, the arrays being formed, for example, by a photolithographic process from a layer of a suitable metal deposited on the surface of the wafer.

The frequency response of the filter is determined by the number, spacing and dimensional configuration of the electrodes making up each transducer. For convenience of computation, a mathematical model of the array is considered in which each electrode is regarded as representing an individual acoustic surface-wave source and the results obtained from this model are found to be generally satisfactory in practice for design purposes. By employing techniques of Fourier synthesis and computer optimisation on this mathematical model, a suitable relative distribution of magnitude and spacing of such sources in the launching and receiving transducer arrays can be determined which can provide a good approximation to a desired band-pass response. The spacing of the launching and receiving transducers along the line of propagation of the acoustic surface waves will introduce a delay in the signal path. However, in many applications such a delay is not important or can be allowed for. For example, in the case of an intermediate frequency filter for a television receiver, since the entire received signal receives the same delay, this delay is simply equivalent to displacing the receiving aerial further from the transmitter. Alternatively this delay property of the device can be employed to provide a desired delay of a given signal.

A problem with the above-described devices is that in additinn to a wanted signal produced by the surface wave travelling from one transducer to the other, there are also unwanted signals produced by acoustic surface waves reflected from the edges of the wafer behind the launching transducer and the receiving transducer. These reflected acoustic surface waves will produce spurious signals in the output of the receiving transducer which must be reduced to an acceptable level so that they do not interfere with the performance of the device. A known method of reducing these spurious signals is to suppress the reflected waves by placing an absorbant material, such as black wax, at the edges of the wafer. However, this is an awkward technique and represents an extra step in the production of the device, which is costly.

An object of this invention is to provide means whereby the problem of end reflected acoustic surface waves is reduced without the disadvantages associated with the method of placing an absorbant material at the edges of the wafer.

According to the invention there is provided an acoustic surface-wave device including a wafer of piezoelectric material on one surface of which a launching transducer and a receiving transducer are formed, each transducer including at least one interdigital electrode array. The transducers are arranged, or additional means are provided on said surface whereby, in operation, acoustic surface waves reflected from the ends of the wafer arrive in antiphase at the receiving transducer over one or more portions of its aperture with those over the remainder of its aperture so as to substantially reduce the signal in the receiving transducer output due to the end reflected waves.

The invention will now be described in more detail with reference to the accompanying drawings, in which FIGS. 1 to 4 show schematically in plan view first, second, third and fourth embodiments respectively of an acoustic surfacewave device according to the invention.

Referring now to FIG. 1, a wafer 1 of piezoelectric material has applied to its upper surface a launching transducer 2 and a receiving transducer 3. The transducers comprise arrays of interdigital electrodes formed on the surface of the body 1, suitably by photolithography from a vapour-deposited layer of metal.

The launching transducer 2 is a single-section interdigital electrode array adapted to direct acoustic surface waves at the receiving transducer 3, parallel to the line of acoustic surface-wave propagation 4. The receiving transducer 3 is also a single-section interdigital electrode array and is adapted to receive the acoustic surface waves launched by the transducer 2. Each of the arrays 2 and 3 can be designed with the equivalent source strength at the position of each strip electrode or finger 5 predetermined by adjusting the amount of overlap between that finger and the two adjacent fingers of opposite polarity.

Parallel conductive strips 6, 7 connect together the ends of fingers 5 of the same polarity and lead to respective input terminals 8, 9 of the launching transducer 2. Parallel strips 10, 11 connect together the ends of fingers 5 of the same polarity and lead to respective output terminals 12, 13 of the receiving transducer 3.

The limits of the finger overlap envelope define the acoustic aperture of the transducers 2 and 3. On both the transducers 2 and 3, the fingers 5 are staggered at the mid-point of the aperture so as to define two channels A and B. The finger portions in channel A are shifted in the line of acoustic surface-wave propagation 4 by a quarter-wavelength, $\lambda/4$, at the fundamental frequency of operation of the device, towards the left-hand end L of the wafer with respect to the position of the finger portion in channel B.

In operation, the launching transducer 2 will generate acoustic surface waves travelling towards the receiving transducer 3 in the line of propagation 4. Due to the mid-aperture stagger of the fingers in the transducer 2 the waves travelling in this direction in channel A will lag behind those in channel B by $\lambda/4$, but due to the corresponding mid-aperture stagger of the fingers in the receiving transducer 3 the waves in both channels will be received in phase at the transducer 3 and no loss will occur in the wanted signal. The launching transducer 2 will also generate unwanted acoustic surface waves which travel to the left-hand end L of the wafer 1, which is orthogonal to the line of propagation 4, where they are reflected and then travel to the receiving transducer 3. At the wafer end L these unwanted waves in channel A are λ/4 ahead of the unwanted waves in channel B, which are also true after reflection. The stagger of the fingers in the receiving transducer 3 adds a further λ/4 to the phase difference between these unwanted waves in the two channels which are thus received by the receiving transducer 180° out-of-phase and thereby cancel out so that no spurious signal is produced. A proportion fraction of the waves generated by the launching transducer 2 towards the receiving transducer 3 will travel through to the right-hand end R of the wafer 1, which is orthogonal to the line of propagation 4, where they are reflected and then travel as unwanted surface waves to the receiving transducer 3. At the wafer end R these unwanted waves in channel A are λ/4 behind the unwanted waves in channel B, which is also true after reflection. The stagger of the fingers in the receiving transducer 3 adds a further λ/4 to the phase difference, so that these unwanted waves in the two channels are received in antiphase at the transducer 3 and no spurious signal is produced.

It will be appreciated that complete cancellation of the end reflected signals as described above with respect to FIG. 1 depends on conditions in the two channels being exactly the same which means, inter alia, perfect alignment of the transducers 2 and 3 with respect to perfectly straight edges L and R of the wafer which are orthogonal to the propagation direction. In practice there will be at least a substantial reduction of spurious signals in the receiving transducer output due to these unwanted end reflected acoustic surface waves.

A known alternative to the conventional single-section electrode array acoustic surface-wave transducer, where a low input or output impedance is required to match the circuit in which the acoustic surface-wave device is connected, is the double-section electrode array transducer. For a given overall acoustic aperture a double-section transducer with its two sections connected in series has one quarter the capacitance of a single-section transducer.

Figure 2:
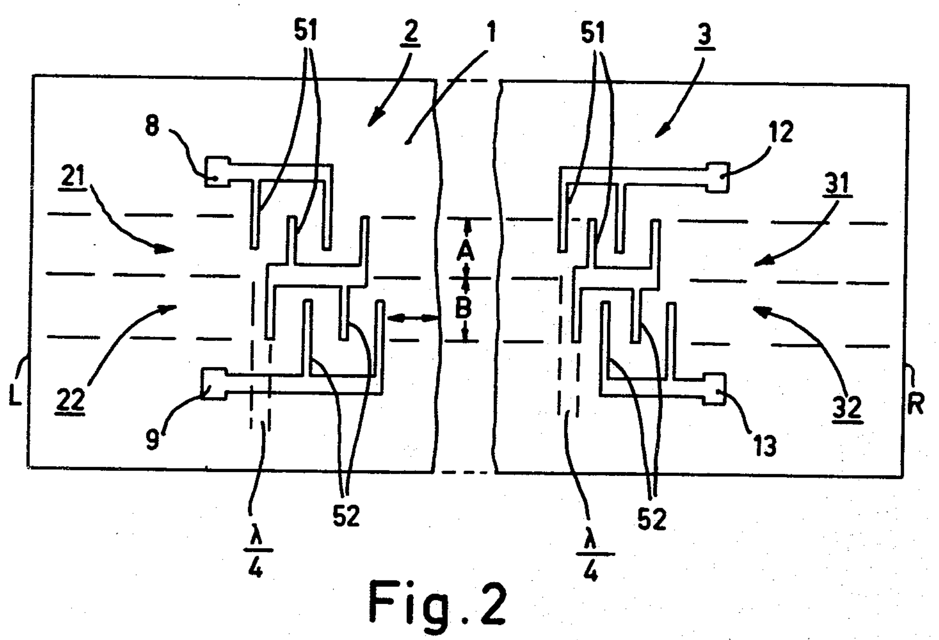

Referring now to FIG. 2, there is shown an arrangement modified with respect to that shown in FIG. 1 in that the transducers 2 and 3 both comprise double-section interdigital electrode arrays instead of the single-section electrode arrays shown in FIG. 1. The launching transducer 2 and the receiving transducer 3 respectively comprise two interdigital arrays 21, 22 and 31, 32 occupying the adjacent channels A and B. The fingers 51 of the arrays 21 and 31 are shifted in the same direction by a quarter-wavelength with respect to the corresponding fingers 52 of the arrays 22 and 32. In operation the acoustic surface waves which are generated by the launching transducer 2 and reflected from the ends L and R of the wafer 1 arrive at the receiving transducer 3 in antiphase in the two channels A and B. The effect of the quarter-wavelength shift is thus the same as for the arrangement of FIG. 1.

Figure 3:
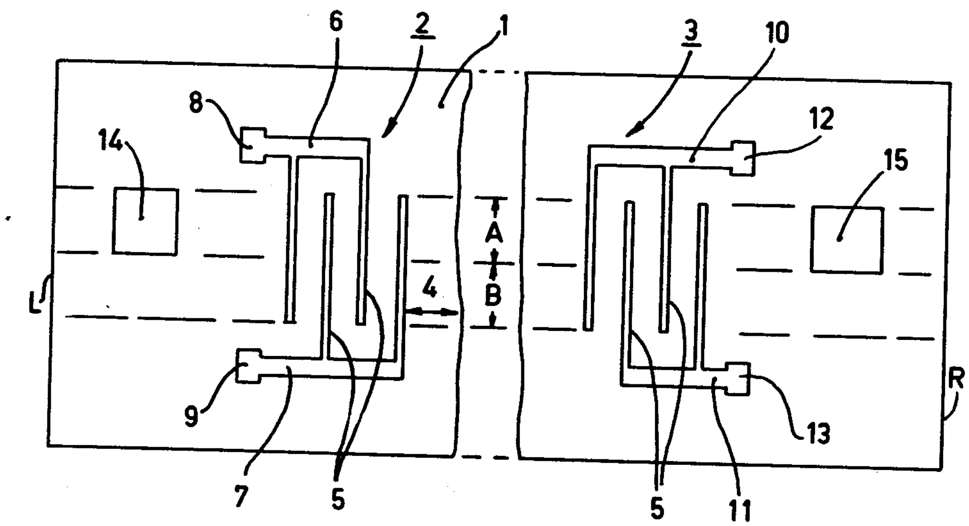

Referring now to FIG. 3, there is shown an acoustic surface-wave device having an launching transducer 2 and a receiving transducer 3, each including a conventional single-section interdigital electrode array. The surface of the wafer 1 behind the transducer 2, i.e. between the transducer 2 and the left-hand end L of the wafer, has arranged thereon a metallised portion 14 which extends over half the acoustic aperture of the transducers 2 and 3, i.e. over channel A.

It is known that the velocity of acoustic surface waves is affected by travelling under a metallised surface on a piezoelectric material. From a knowledge of the coupling constant for acoustic surface waves for the particular material of wafer 1 and the thickness and mechanical properties of the metal layer, the velocity change, and hence the phase change at a particular fundamental frequency, of an acoustic surface wave due to passage under a metallised surface of particular length in the path of the wave, can be calculated. The length of the metallised portion 14 is accordingly chosen such that after passage under that portion the velocity of surface waves in channel A will be changed by an amount equivalent to a phase change of 90 degrees relative to surface waves in channel B.

In operation, the launching transducer 2 will generate unwanted acoustic surface waves which travel to the left-hand end L of the wafer where they are reflected and then travel to the receiving transducer 3. These unwanted waves in channel A pass under the metallised portion 14 twice and each time undergo a 90° phase change in the same sense. The unwanted waves in channels A and B are thus received by the transducer 3 180 degrees out-of-phase and cancel out so that no spurious signal is produced.

A metallised portion 15, similar to the portion 14, is arranged in channel A behind the receiving transducer 3, i.e. between the transducer 3 and the right-hand end R of the wafer 1. A proportion of the acoustic surface waves generated by the launching transducer 2 towards the receiving transducer 3 will travel through to the right-hand end R of the wafer 1 where they are reflected and then travel as unwanted surface waves to the receiving transducer 3. These unwanted waves in channel A pass under the metallised portion 15 twice and so are 180 degrees out-of-phase with the unwanted waves in channel B at the receiving transducer 3 and thereby cancel out.

Instead of having a single metallised surface portion behind each transducer as described above with reference to FIG. 3, the same effect could be achieved by having two or more metallised portions behind either or both transducers. The sum of the widths of the two or more metallised portions must in each case be such as to cover half the acoustic aperature of the transducers so that the end reflected waves over that half of the aperture will be in antiphase with the end reflected waves over the other half of the aperture at the receiver transducer 3.

Figure 4:
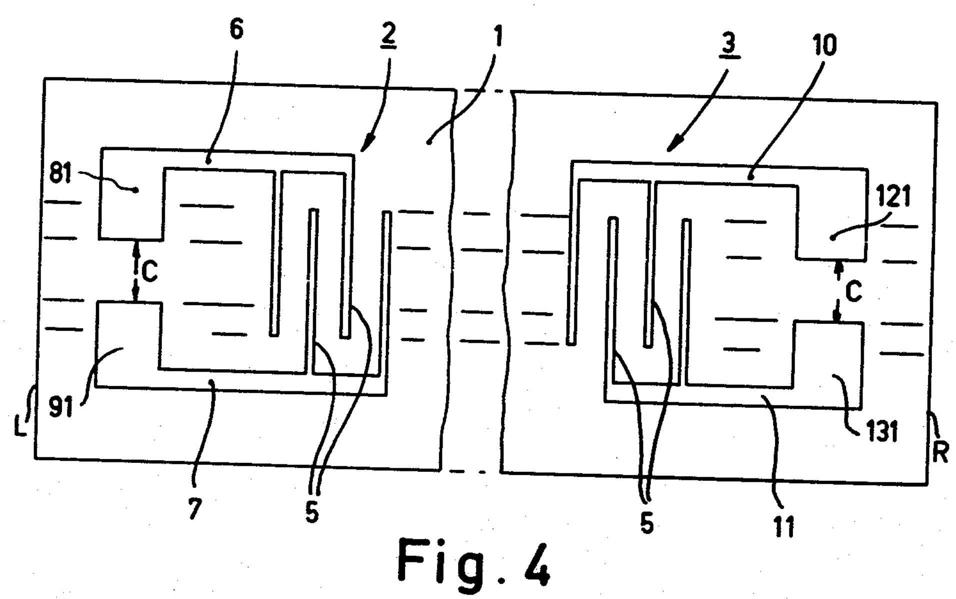

Referring now to FIG. 4, there is shown an arrangement modified with respect to that shown in FIG. 3. The terminal portions 8, 9, 12 and 13 of FIG. 3 have been enlarged to form the terminal portions 81, 91, 121 and 131 of FIG. 4. The portions 81 and 91 have the same length in the path of the acoustic surface waves as the portion 14 of the FIG. 3 arrangement, i.e. so as to produce a phase leg of 180 degrees after a double passage thereunder, and together cover half the acoustic aperture of the transducers. The remaining half of the acoustic aperture is shown as defining a channel C. Similarly the portions 121 and 131 perform the same function as the portion 15 of the arrangement of FIG. 3. In addition to the effect of cancelling unwanted end reflected acoustic surface waves, the enlarged portions 81, 91, 121 and 131 are advantageous for connection purposes.

The use of metallised portions to introduce a phase lag is not, of course, limited to the single-sectioned transducers as shown in FIGS. 3 and 4.

It will be appreciated that a particular advantage of all the arrangements above-described with reference to FIGS. 1 to 4 is that the means for cancelling unwanted end reflected acoustic surface waves, whether it be by the arrangement of the fingers of the transducers or by the extra metallised portions, can be formed in the same process steps together with the launching and receiving transducers.

The term 'acoustic surface waves' used hereinbefore is to be taken as referring to both Rayleigh waves, which are the waves conventionally utilised in the type of device to which this invention is applicable, and to Bleustein-Gulyaev waves.

It should be appreciated that since the Bleustein-Gulyaev wave's particle motion does not have a component out of the surface, the known method of suppressing Rayleigh wave and reflections by the use of absorbant material is not effective to suppress Bleustein-Gulyaev wave end reflections. The arrangements above-described according to this invention are, however, effective to suppress Bleustein-Gulyaev wave end reflections and so make possible the manufacture of efficient devices where the crystal orientation and finger spacing of the transducers is chosen to suit these waves.

An acoustic surface-wave device launcher transducer can in operation also launch small amplitude bulk waves which will also be reflected at the ends of the wafer and picked up by the receiver transducer. The arrangements described above with reference to FIGS. 1 and 2 should also suppress these end reflected bulk waves, although the arrangements described above with reference to FIGS. 3 and 4 will not.

What is claimed is:

1. An acoustic surface-wave device comprising a wafer of piezoelectric material capable of propagating acoustic surface waves on one surface, launching transducer assembly means coupled to said one surface, receiving transducer means coupled to said one surface, each transducer means including at least one interdigital electrode array, said launching and receiving transducer means being arranged on said one surface whereby, in operation, acoustic surface waves reflected from the ends of the wafer are received in antiphase at the receiving transducer means over one portion of its aperture with respect to end reflected acoustic waves received over a second portion of its aperture thereby to substantially reduce the signal in the receiving transducer means output due to the end reflected acoustic surface waves.

2. An acoustic surface-wave device as claimed in claim 1, wherein the launching transducer electrode array is staggered at the mid-point of its aperture so that, in operation, acoustic surface waves are launched in two channels 90 degrees out-of-phase, and wherein the receiving transducer electrode array is staggered at the midpoint of its aperture so that acoustic surface waves arriving direct from the launching transducer are received at the receiving transducer in phase in the two channels whereas acoustic surface waves reflected from the ends of the wafer are received in antiphase in the two channels.

3. An acoustic surface-wave device as claimed in claim 2, wherein the launching transducer includes a single section interdigital array whose electrodes are each staggered at the mid-point of the launching transducer aperture.

4. An acoustic surface-wave device as claimed in claim 2, wherein the launching transducer includes a double-section interdigital array with each section occupying half the launching transducer aperture and the electrodes of one section being staggered with respect to the corresponding electrodes of the other section.

5. An acoustic surface-wave device as claimed in claim 1, wherein said launching transducer assembly means includes at least one metal area located between the launching transducer interdigital electrode array and the adjacent end of the wafer and occupying half the receiving transducer aperture, each metal area being arranged to change the velocity of acoustic surface waves passing under it by an amount equivalent to a phase change of 90 degrees whereby, in operation, acoustic surface waves reflected from the end of the wafer adjacent the launching transducer which have passed twice under a metal layer are received in antiphase at the receiving transducer with respect to acoustic surface waves reflected from the end of the wafer adjacent the launching transducer but which have not passed under said metal layer, and further comprising means provided on the one surface of the wafer for causing acoustic surface waves reflected from the end of the wafer adjacent the receiving transducer to be received in antiphase at the receiving transducer over one portion of its aperture with respect to end reflected acoustic surface waves received over a second portion of its aperture.

6. An acoustic surface-wave device as claimed in claim 1, wherein the launching transducer includes terminal electrodes extended to occupy half the receiving transducer aperture, each extended terminal electrode being arranged to change the velocity of acoustic surface waves passing under it by an amount equivalent to a phase change of 90 degree whereby, in operation, acoustic surface waves reflected from the end of the wafer adjacent the launching transducer which have passed twice under an extended terminal electrode are received in antiphase at the receiving transducer with respect to acoustic surface waves reflected from the end of the wafer adjacent the launching transducer but which have not passed under an extended terminal electrode, and further comprising means provided on the one surface of the wafer for causing acoustic waves reflected from the end of the wafer adjacent the receiving transducer to be received in antiphase at the receiving transducer over one portion of its aperture with respect to end reflected acoustic surface waves received over a second portion of its aperture.

7. An acoustic surface wave device comprising, a substrate composed of an acoustic surface wave propagating material, a launching transducer coupled to one surface of said substrate at a first location for propagating acoustic surface waves in two channels along a predetermined path in said substrate, a receiving transducer coupled to said one surface of the substrate at a second location on said predetermined path spaced from said first location such that acoustic surface waves arriving direct from the launching transducer are received in phase in the two channels at respective first and second segments of the receiving transducer aperture, and means including one of said transducers for inhibiting the effect on the receiving transducer of acoustic surface waves reflected from the ends of the substrate lying perpendicular to said predetermined path by causing the end reflected waves in said two channels to arrive 180° out of phase at said first and second segments of the receiving transducer aperture.

8. An acoustic surface wave device as claimed in claim 7 wherein said inhibiting means comprises, a launching transducer including a first interdigital array of electrodes staggered at the midpoint of its aperture so that acoustic surface waves 90° out of phase are launched in said two channels, and a receiving transducer including a second interdigital array of electrodes parallel to said first electrode array and staggered at the midpoint of its aperture so that the electrodes of said first electrode array are equally spaced apart from corresponding electrodes of the second electrode array whereby the direct arriving acoustic surface waves are received at the receiving transducer electrode array in phase in said two channels whereas the end reflected acoustic surface waves are received 180° out of phase in the two channels at the receiving transducer electrode array.

9. An acoustic surface wave device as claimed in claim 7 wherein said inhibiting means comprises, a launching transducer including a first interdigital array of electrodes comprising two interleaved combs of electrodes, each electrode comprising two parallel nonaligned linear segments spaced apart one quarter of a wavelength in the direction of the predetermined propagation path whereby acoustic surface waves 90° out of phase are launched in said two channels, and a receiving transducer including a second interdigital array of electrodes parallel to said first electrode array and comprising two interleaved combs of electrodes, each electrode of said second electrode array comprising two parallel nonaligned linear segments spaced apart one quarter of a wavelength in the direction of the predetermined propagation path whereby the direct arriving acoustic surface waves are received at the receiving transducer electrode array in phase in said two channels whereas the end reflected acoustic surface waves are received 180° out of phase in the two channels at the receiving transducer electrode array.

10. An acoustic surface wave device as claimed in claim 7 wherein said inhibiting means comprises, a launching transducer including a double-section interdigital array of electrodes with each section occupying half the launching transducer aperture with corresponding electrodes of each section spaced apart one quarter wavelength in the direction of said predetermined propagation path.

11. An acoustic surface wave device as claimed in claim 10 wherein said inhibiting means further comprises, a receiving transducer including a double-section interdigital array of electrodes with each section occupying half the receiving transducer aperture with corresponding electrodes of each section spaced apart one quarter wavelength in the direction of said predetermined propagation path.

12. An acoustic surface wave device as claimed in claim 7 wherein said inhibiting means comprises a metal area occupying one of said two channels and located on said one surface between one of said transducers and the adjacent end of the substrate and dimensioned to alter the velocity of acoustic surface waves propagating past it to introduce a one quarter wavelength phase change for each passage of the acoustic surface waves.

13. An acoustic surface wave device as claimed in claim 12 wherein said inhibiting means further comprises a second metal area occupying said one channel and located on said one surface between the other one of said transducers and the adjacent end of the substrate and dimensioned to alter the velocity of acoustic surface waves propagating past it to introduce a one quarter wavelength phase change for each passage of the acoustic surface waves.

14. An acoustic surface wave device as claimed in claim 13 wherein the launching and receiving transducer each comprise an interdigital array of electrodes with the launching transducer arranged to launch in phase acoustic surface waves in said two channels.

15. An acoustic surface wave device as claimed in claim 7 wherein said inhibiting means comprises first and second terminal electrodes on one of said transducers extended to occupy a respective one of the two channels and located between the adjacent end of the substrate and the interdigital array of transducer electrodes and with each extended terminal electrode dimensioned to alter the velocity of acoustic surface waves propagating past it to introduce a one quarter wavelength phase change for each passage of the acoustic surface waves.

* * * * *